US005773863A

United States Patent [19]
Burr et al.

[11] Patent Number: 5,773,863
[45] Date of Patent: Jun. 30, 1998

[54] LOW POWER, HIGH PERFORMANCE JUNCTION TRANSISTOR

[75] Inventors: James B. Burr, Foster City; Michael P. Brassington, Sunnyvale, both of Calif.

[73] Assignee: Sun Microsystems, Inc., Mt. View, Calif.

[21] Appl. No.: 292,513

[22] Filed: Aug. 18, 1994

[51] Int. Cl.[6] ......................... H01L 29/76; H01L 29/788; H01L 29/94

[52] U.S. Cl. ........................... 257/344; 257/316; 257/408

[58] Field of Search ..................................... 257/408, 344, 257/327, 328, 329, 335, 336, 337, 376

[56] References Cited

U.S. PATENT DOCUMENTS

| | | | |
|---|---|---|---|
| 4,271,424 | 6/1981 | Inayoshi et al. | 257/367 |
| 5,060,033 | 10/1991 | Takeuchi | 257/344 |
| 5,166,765 | 11/1992 | Lee et al. | 257/345 |
| 5,289,027 | 2/1994 | Terrill et al. | 257/327 |
| 5,359,221 | 10/1994 | Miyamoto et al. | 257/327 |
| 5,374,839 | 12/1994 | Jeon et al. | 257/372 |
| 5,378,909 | 1/1995 | Chang et al. | 257/408 |

FOREIGN PATENT DOCUMENTS

| | | | |
|---|---|---|---|
| 63-300567 | 7/1988 | Japan . | |
| 2-1173 | 5/1990 | Japan | 257/344 |

OTHER PUBLICATIONS

"High Performance 0.1μm Room Temp Si MosFets"; Yan et al Symposium on VLSI Technology Digest of Technical Papers, pp. 86–87, 1992.

Yan, R. H.; Lee, K. F.; Jeon, D.Y.; Kim, Y. O.; Park, B. G.; Pinto, M. R.; Rafferty, C. S.; Tennant, D. M.; Westerwick, E. H.; Chin, G. M.; Morris, M.D.; Early, K.; Mulgrew, P.; Mansfield, W. M.; Watts, R. K.; Voshchenkov, A. M.; Bokor, J.; Swartz, R. G.; and Ourmazd, A.; "High Performance 0.1μm Room Temperature Si MOSFETs", Symposium on VLSI Technology Digest of Technical Papers, pp. 86–87, 1992.

Aoki, M.; Ishii, T.; Yoshimura, T.; Iiiyima, S., Yamanaka, T.; Kure, T.; Ohyu, K.; Shimohigashi, K.; "0.1 μm CMOS Devices Using Low–Impurity Channel Transistors (LICT)", pp. 9.8.1–9.8.3, IEDM, 1987.

Yoshimura, Hisao; Matsuoka, Fumitomo; and Masakaru, Kakumu "New CMOS Shallow Junction Well FET Structure (CMOS–SJET) for Low Power–Supply Voltage", Semiconductor Device Engineering Laboratory, Japan, Proceedings of IEDM (1992), pp. 909–912.

Burr, James B, and Peterson, Allen M.; "Energy Considerations in Multichip–Module Multiprocessors", *IEEE International Conference on Computer Design*, pp. 593–600, 1991.Burr, J. and Peterson, A.; "Ultra Low Power CMOS Technology", *NASA VLSI Design Symposium*, pp. 4.2.1–4.2.13, 1991.

(List continued on next page.)

*Primary Examiner*—Wael Fahmy
*Attorney, Agent, or Firm*—Beyer & Weaver, LLP

[57] ABSTRACT

An improved junction transistor requiring low power and having high performance is described. The transistor includes a substrate, a well region of a first conductivity type, and source and drain regions of a second conductivity type separated by a channel region. The transistor further includes a gate region positioned on the surface of the substrate over the channel region, and a buried region of the first conductivity type is positioned within the well region and below the surface of the substrate. The buried region has a dopant concentration of the first conductivity type sufficiently high to slow the growth of source-drain depletion regions and diminish the likelihood of punch through. The buried region may take the form of a buried electrode region or a retrograde well in alternate embodiments. The device is characterized by a gate threshold voltage of at most about 150 mV which can be electrically adjusted using back biasing or floating gate techniques.

12 Claims, 5 Drawing Sheets

OTHER PUBLICATIONS

Burr, Jim; "Stanford Ultra Low Power CMOS", Symposium Record, Hot Chips. V, pp. 7.4.1–7.4.12, Stanford, CA, 1993.

"A New Lease on Life for Old–Fashioned Chips", Business Week, Science and Technology, p. 100, Dec. 20, 1993.

Burr, James B., and Scott, John, "A 200m V Self–Testing Encoder/Decoder using Stanford Ultra–Low Power CMOS", IEEE International Solid–State Circuits Conference, 1994.

Notes from Dr. Burr's dinner meeting with Hitachi employee.

Okumura, Yoshinori; Shirahata, Masayoshi; Hachisuka, Atsushi; Okudaira, Tomonori; Arima, Hideaki; and Matsukawa, Takayuki; "Source–to–Drain Nonuniformly Doped Channel (NUDC) MOSFET Structures for High Current Drivability and Threshold Voltage Controllability", pp. 2541–2552, IEEE Transaction on Electron Devices, vol. 39, No. 11, Nov. 1992.

Sai–Halasz, George A.; Wordeman, Matthew R.; Kern, D.P.; Rishton, S.; and Ganin, E. "High Transconductance and Velocity Overshoot in NMOS Devices at the 0.1 μm Gate–Length Level", pp. 464–466, IEEE Electron Device Letters, vol. 9, No. 9, Sep. 1988.

LOW POWER, HIGH PERFORMANCE JUNCTION TRANSISTOR

BACKGROUND OF THE INVENTION

The present invention relates generally to an improved transistor device, and more specifically to a high performance CMOS transistor having a low supply voltage and low power consumption.

Metal-oxide-semiconductor field effect transistors (MOSFETs) are used in a wide variety of electrical components and circuits. A standard prior art MOSFET transistor 10 is shown in FIG. 1. A semiconductor substrate 12 has a bulk well 14 of a specific conductivity type; in the example shown, p-type material has been implanted. A source region 16 and a drain region 18 are implanted in the well 14 having opposite conductivity type to the well 14 (n-type material in the example). An oxide or other type of insulating layer 20 is deposited on the surface of the well 14, and a gate layer 22 of a similar conductivity type as the source and drain is typically deposited over the insulating layer 20. The threshold voltage (Vt) is the voltage that, when applied to the gate 22, causes a channel 24 to form between the source 16 and drain 18 of the transistor and turns the transistor on so that current flows in the channel as indicated by arrow 26. A typical CMOS Vt is about 0.7 volts.

As MOS technology has evolved, the supply voltage (Vdd) has scaled with the size of the devices. For example, CMOS transistors having channel widths in the range of 2 μm are provided with 5 volt supply voltages, whereas transistors having channel widths in the range of 0.5 μm are provided with 3.3 volt supply voltages. As channel widths decrease to 0.35 μm and 0.25 μm, the supply voltages correspondingly decrease to 2.5 and 1.8 volts. For many applications, it would be desirable to provide lower supply voltages for given device sizes. Generally, devices requiring lower supply voltages conserve power, a feature which is especially desirable in systems which dissipate large amounts of energy or rely on limited power sources such as batteries.

In general, when operating a CMOS transistor at a lower supply voltage, a lower threshold voltage is required so that a reduction in performance is minimized. According to the papers "Energy Considerations in Multichip-Module based Multiprocessors," by J. B. Burr and A. M. Peterson, *IEEE International Conference on Computer Design*, pages 593–600, 1991, and "Ultra Low Power CMOS Technology," by J. Burr and A. Peterson, *NASA VLSI Design Symposium*, pages 4.2.1–4.2.13, 1991, CMOS transistors dissipate a minimum energy when Vt=Vdd as shown by existing current models and experimental data from actual CMOS circuits. As Vdd is increased above Vt, maximum frequency (a measure of performance) increases. These prior art papers disclose that while performance (i.e. frequency) generally tends to decrease when lowering supply voltage and threshold voltage, the energy and power consumption of the transistor is reduced to a greater degree than the performance, which can be desirable for low power applications.

Unfortunately, when the threshold voltage of a CMOS transistor is lowered to near zero, some special problems can arise. First, as Vt is lowered, the leakage current of the transistor—which is the current flowing across the channel when the transistor is off—increases. For some applications in which the device must frequently switch (e.g. microprocessors), this is not a problem. However, for applications in which the device is normally inactive (e.g., in memory devices), the leakage current can cause the device to be quite energy inefficient. Regardless of whether the leakage current represents a significant problem, lowering the threshold voltage of transistors has been difficult to accomplish. Specifically, manufacturing process variations in substrate forming and doping have limited the accuracy of threshold voltages and were normally thought to place a lower limit on possible threshold voltages for transistors. In addition, environmental effects such as temperature variations can substantially alter the threshold voltage of a low threshold voltage device.

However, a technique known as backbiasing has been used to electrically tune the threshold voltage of low threshold voltage CMOS devices. See James B. Burr, "Stanford Ultra Low Power CMOS," Symposium Record, Hot Chips V, pp. 7.4.1–7.4.12, Stanford, Calif. 1993. Back biasing is accomplished by controlling the potential difference between the source and well regions of the transistor. As this potential difference is increased, the magnitude of the threshold voltage increases. Thus, by using back biasing, threshold voltages can be tuned to compensate for process variations in manufacturing and environmental effects and to optimize threshold voltages according to a transistor's activity in a circuit, thereby allowing a lower Vdd to be used and power consumption to be decreased, while maintaining good performance.

It should be noted that the process used to prepare low Vt devices differs only slightly from the standard process of preparing long channel CMOS transistors with conventional Vt values. In the standard process, a surface implant of a dopant of opposite conductivity type to the conductivity type of the channel region 24 of the well 14 is made to adjust the Vt of the device to a standard level. The transistor has a resulting standard Vt of about 0.7 volts or −0.7 volts (depending on the conductivity type of the transistor). To achieve a low Vt, the step of implanting the surface implant can be omitted and back biasing can then be used to adjust Vt to a desired voltage level above or below zero. In addition, for PFETs, the gate must be doped p-type (opposite the doping of the channel region).

A reduction in frequency and performance of a transistor when supply voltage is reduced has been mainly exhibited in long channel MOSFET transistors. Using the existing models and equations for CMOS transistors, it has been found that short channel MOS transistors and long channel MOS transistors behave differently when supply voltages and threshold voltages are adjusted. Long channel devices typically have source and drain regions positioned further apart (generally approaching 2 μm or more), while short channel devices have relatively closely-spaced source and drain regions (generally less than about 2 μm). The relationship of maximum frequency $f_{max}$ to supply voltage and threshold voltage is governed by long and short channel effects. For longer devices, the long channel effects predominate and for short channel devices, the short channel effects predominate. Most devices exhibit some characteristics of both. The maximum frequency in the limit of a truly long channel device is given by:

$$f_{max} \propto (V_{dd}-V_t)^2/V_{dd}$$

The same relationship in the limit of a short channel device is given by:

$$f_{max} \propto (V_{dd}-V_t)/V_{dd} = 1-V_t/V_{dd}$$

From these equations, it is known that the performance (frequency) of a long channel device is dependent on the absolute value of Vdd, the supply voltage; if supply voltage is lowered, performance is also lowered. However, in short channel devices, performance is much more dependent on the ratio of threshold voltage to supply voltage (Vt/Vdd). This means that the supply voltage can often be lowered in short channel devices with no loss in performance f as long as the ratio Vt/Vdd is kept constant. For many devices, this relation is nearly true, and it becomes exactly true if the saturation voltage scales with the supply voltage.

Short channel devices are thus much more desirable in low power applications, since the supply voltage can be lowered and the performance of the device will remain the same. Unfortunately, short channel devices having low threshold voltages have a significant problem. The distance between the source and drain regions may be so small that the depletion regions in the well adjacent the source and drain can overlap to form a conductive channel. This results in the effect known as punch through, in which current flows through the channel created by depletion region, even when the transistor is turned "off" (i.e., no voltage is applied to gate). When this occurs, a device cannot be back biased because the depletion region positioned in the channel masks out the potential of the bulk region, which is needed to tune the threshold voltage. Thus, the threshold voltage of the transistor can not be electrically tuned.

What is needed is an apparatus and method that provides a short channel transistor device having a low threshold voltage, a low supply voltage, and no loss or an increase in performance of the device. What is also needed is a short channel transistor device having a tunable threshold voltage and protection from punch through effects.

SUMMARY OF THE INVENTION

To achieve the foregoing in accordance with the purpose of the present invention, an improved junction transistor is disclosed having high performance at a low supply voltage. Transistors of the present invention have low and/or tunable threshold voltages and "buried regions" to prevent punch through.

In one aspect, the invention provides an improved junction transistor having a low (often near zero) gate threshold voltage and a buried region of elevated dopant concentration within the well to limit the size of depletion regions extending from the source and drain regions and thereby prevent punch through. The improved transistor is formed on a semiconductor substrate and includes a well region of a first conductivity type which extends from a top surface of the semiconductor substrate downward into the substrate.

The transistor also includes a source region and a drain region of a second conductivity type positioned within the well region and separated from one another by a channel region.

Above the channel region on the substrate surface is a gate having a low threshold voltage.

Preferably, the gate threshold voltage has a magnitude of at most about 150 mV (more preferably at most about 120 mV) or, defined another way, the Vg (gate voltage) versus I (current) curve for the device reaches zero gate voltage on the subthreshold region of the curve at a point that is at most about 2 decades (in current) from the threshold voltage (onset of strong inversion). To permit threshold voltages in this region, the channel region preferably has a dopant concentration of between about $1\times10^{14}$ and $5\times10^{16}$ atoms/cm$^3$.

Further, for a PFET, the gate as well as the source and drain regions will be degenerately doped with p-type dopants, preferably at a concentration of between about $5\times10^{19}$ and $2\times10^{20}$ atoms/cm$^3$. Correspondingly, for an NFET, the gate as well as the source and drain regions will be heavily doped with n-type dopants, preferably at a concentration of between about $5\times10^{19}$ and $2\times10^{20}$ atoms/cm$^3$.

Further in accordance with this aspect of the invention, the transistor includes a buried region of the first conductivity type positioned within the well region and disposed outside of the channel region and below the surface of said semiconductor substrate. Also, the buried region has a dopant concentration of the first conductivity type that is greater than the average dopant concentration in the well region. Preferably, the dopant concentration within the buried region is greater than about $1\times10^{17}$ atoms/cm$^3$. Further, the dopant concentration in the buried region is between about 10 and 100 times greater than it is in the surrounding well.

In a preferred embodiment, the buried region takes the form of a "buried electrode." Within the well region, the buried electrode is a region of relatively high dopant concentration that extends between the source and drain regions and under the channel of the transistor. Typically, the buried electrode is formed by an ion implant after a primary well implant has already been performed. In an alternative embodiment, the buried region takes the form of a "retrograde well" which is specialized well region having a concentration of dopant which gradually increases from the substrate surface to a point below the channel. Typically, a retrograde well is formed by a single implant tailored to provide the described graded dopant concentration.

Another aspect of the invention involves improved transistors having "tunable" gate threshold voltages and buried regions as described. In a preferred embodiment, the threshold voltage can be tuned by controlling the potential between the source and well regions; i.e., through back biasing. Back biasing is permitted by providing isolated ohmic contacts for the source and well regions together with the circuitry necessary for independently controlling the potential of these two regions. In an alternative embodiment, the threshold voltage can be tuned using a floating gate having two gates in series. In a particularly preferred embodiment, the transistor will have a buried region and a threshold voltage near zero which is tunable by back biasing. Further, the preferred transistor will have a channel region that is less than about 2 $\mu$m.

These and other advantages of the present invention will become apparent to those skilled in the art after reading the following descriptions and studying the various figures of the drawings.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
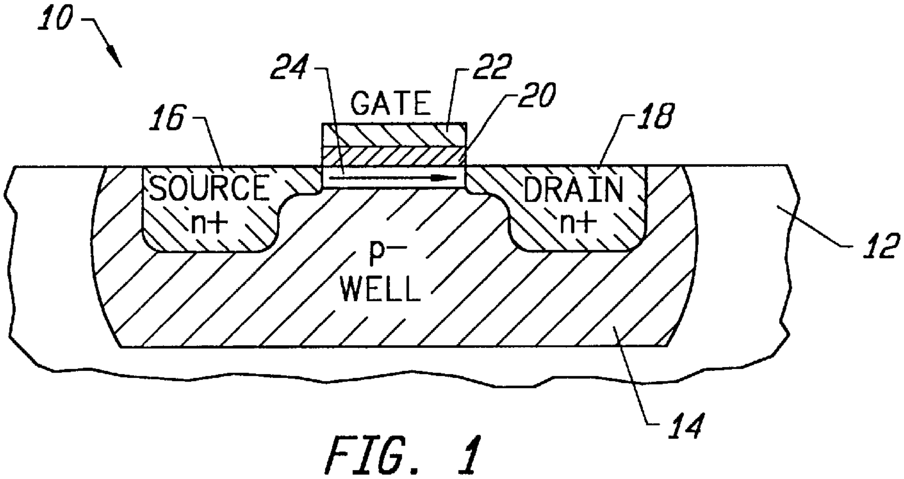
FIG. 1 is a side sectional view of a prior art CMOS transistor.
Figure 2:
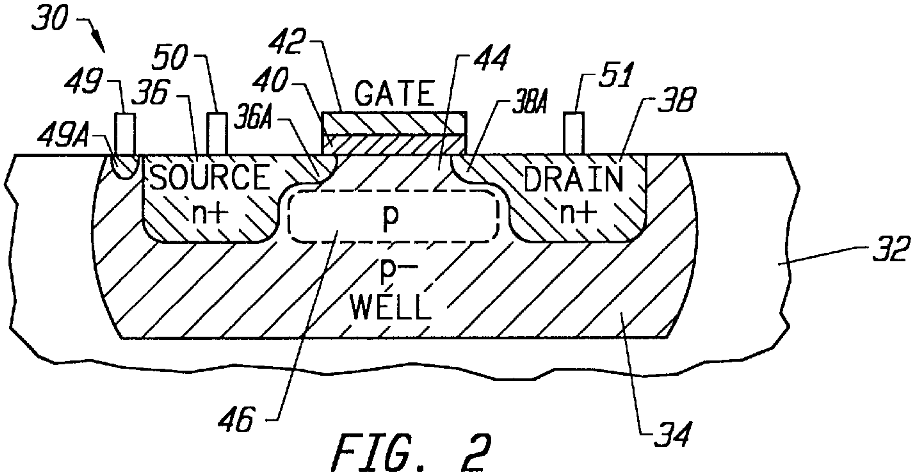
FIG. 2 is a side sectional view of a transistor having a buried region and a gate threshold voltage controllable by back biasing in accordance with the present invention.

FIG. 2 is a side sectional view of a first embodiment of a short channel MOSFET 30 of the present invention having a low, tunable threshold voltage for increased performance. The specific transistor 30 shown in FIG. 2 is an NFET, that is, an n-type transistor having an n-type source, drain and gate and a p-type well. Alternatively, transistor 30 can be a PFET transistor having a p-type source, drain and gate and a n-type well.

Transistor 30 includes a lightly doped well region 34 extending downward from the surface of a semiconductor substrate 32 into its bulk. Preferably, the well region—excluding the source, drain, and buried regions—has an average dopant concentration of between about $1\times10^{15}$ and $5\times10^{16}$ atoms/$cm^3$. A heavily doped n-type source region 36 with an associated "tip" 36A and a corresponding heavily doped drain region 38 with an associated tip 38A are provided in well region 34 as shown. The dopant concentrations of the source region 36 and drain region 38 are each between about 1 and $2\times10^{20}$ atoms/$cm^3$. The dopant concentrations of the tips are between about 4 and $5\times10^{19}$ atoms/$cm^3$. A channel region 44 having a dopant concentration of between about $1\times10^{15}$ and $5\times10^{16}$ atoms/$cm^3$ extends between the source and drain tip regions 36A and 38A. As is conventional in the art, the thin tip regions (as opposed to the deeper main parts) of the source and drain are provided adjacent to channel region 44 to reduce the detrimental effects of hot electrons, and also to reduce punch through, drain induced barrier lowering, threshold roll off, and related short channel effects. In preferred short channel devices of the present invention, the source and drain regions are positioned such that the inner boundaries of the regions are no more than about 2 $\mu$m apart, and are more preferably in the range of 0.5 $\mu$m or less.

An oxide layer 40 is provided on the surface of the p-type well 34 and overlying the channel region 44. An n-type gate layer 42 is provided on the oxide layer 40 as shown. In general, gate layer 42 will be n-type in NFETs and p-type in PFETs. It should be noted that in older (or larger geometry) high Vt PFETs, the gate layer is n-type. Ohmic contacts 50 and 51 are provided for the source and drain regions respectively. In addition, an electrically isolated ohmic contact is provided to well region 34 so that the potential between the source and well regions can be controlled by an external circuit. This arrangement should be contrasted with conventional MOS devices in which the well and source regions are often coupled together. By providing the isolated contacts 49 and 50 and thereby permitting control over the potential between the well and source regions, the present invention provides the capability of controlling the threshold voltage through backbiasing. The contacts 49, 50, and 51 may be electrically isolated from one another and from gate 42 by an oxide or other insulating layer. Adjacent to the well contact 49 is heavily doped region 49*a* which is provided to ensure an ohmic contact. If the well is p-type, as shown, region 49*a* is doped p+. If, on the other hand, the well is n-type, region 49*a* is doped n+.

A buried electrode region 46 is provided in well 34 extending between source and drain regions 36 and 38 and below channel region 44. The buried electrode region 46 has a "p" concentration, i.e. it has a somewhat higher dopant concentration than the surrounding p- region of well 34. Preferably, the dopant concentration of buried region 46 is between greater than about $1\times10^{17}$ atoms/$cm^3$, and more preferably between about $1\times10^{17}$ and $1\times10^{18}$ atoms/$cm^3$. These ranges apply for both NFETs and PFETs. In especially preferred embodiments, well/buried region has a vertical profile with a concentration of about $1\times10^{16}$ atoms/$cm^3$ at the surface, about $1\times10^{17}$ atoms/$cm^3$ at the edge of the gatebulk depletion region, and drops to about $1\times10^{15}$ atoms/$cm^3$ at a depth shallower than the source-drain junction to minimize junction capacitance. In a PFET device, of course, the buried electrode region is a region of n-type dopant having a similar profile. Some other suitable features of the buried electrode are described in the article by R. H. Yan, et al., "High Performance 0.1 mm Room Temperature Si MOSFETs," 1992 *Symposium on VLSI Technology Digest of Technical Papers*, pages 86–87, which is incorporated herein by reference for all purposes. In that article, a buried electrode or "ground plane" concept is described with respect to conventional high Vt CMOS transistors. The authors were attempting to maintain protection against punchthrough while increasing the performance of high Vt devices by reducing the channel dopant concentration. By decreasing the channel dopant concentration, the authors created a device having a relatively increased dopant concentration (the ground plane) below the channel surface.

In an alternate embodiment of the present invention, a retrograde well is used in place of a buried electrode as described above. In this embodiment, the well region 34 has a graded doping profile in which the dopant concentration in the well gradually increases from the surface into the body of substrate 32 until a point is reached below the channel.

Thus, the concentration of the dopant in the channel region is lower than the concentration in the region immediately below the channel, much like the buried electrode embodiment. In general, devices having retrograde wells do not have as high performance as comparable devices having buried electrodes because the concentration profiles are not as abrupt. However, they are typically less costly to produce, since the step of depositing a buried electrode region is not required.

While not wishing to be bound by theory, it is believed that the following discussion explains how a buried electrode (or retrograde well) allows short channel, low Vt devices to function properly. To achieve a low threshold voltage (Vt) in a CMOS transistor, and permit the use of a low supply voltage (Vdd), a low channel dopant concentration is needed. The low channel concentration increases the mobility of the charge carriers in the channel. The mobility is increased due to a smaller vertical electrical field created in the channel between the low dopant concentration bulk and the gate. The vertical electric field has a smaller magnitude than a standard transistor's vertical electric field due to the low supply and threshold voltages being used. However, the low channel/bulk dopant concentration has negative effects as well. The source-drain depletion regions extending into the channel region increase in size with low dopant concentrations, leading to punch through. Punch through, as mentioned above, is the condition in which charge carriers flow from source to drain, even when the transistor is "off" (a potential of zero volts is applied to the gate). Punch through also decouples the substrate potential from the gate potential, so that the voltage of the bulk cannot be used to adjust the threshold voltage using back biasing.

The buried electrode region 46 allows the advantages of a low dopant channel concentration to exist without the disadvantages of punch through. The depletion regions adjacent the source and drain regions normally begin forming in the bulk well region 34 below the gate where there is a field strength. By providing a buried electrode of higher dopant concentration below the tips of the source and drain regions, the growth of the depletion regions is immediately slowed. Since the source-drain depletion regions cannot extend across the channel region 44, charge carriers will not flow across the channel unless the transistor is turned on. The buried electrode thus greatly reduces the punch through effect. Further, the reduced depletion regions also allow an applied well potential to control the threshold voltage using a back biasing technique, as described above. The bulk voltage is not masked out by large source-drain depletion regions when the buried electrode is used. And, because there still is a low dopant concentration in the channel 44, the benefits of a low vertical electric field and high mobility of charge carriers are not reduced.

Figure 3:
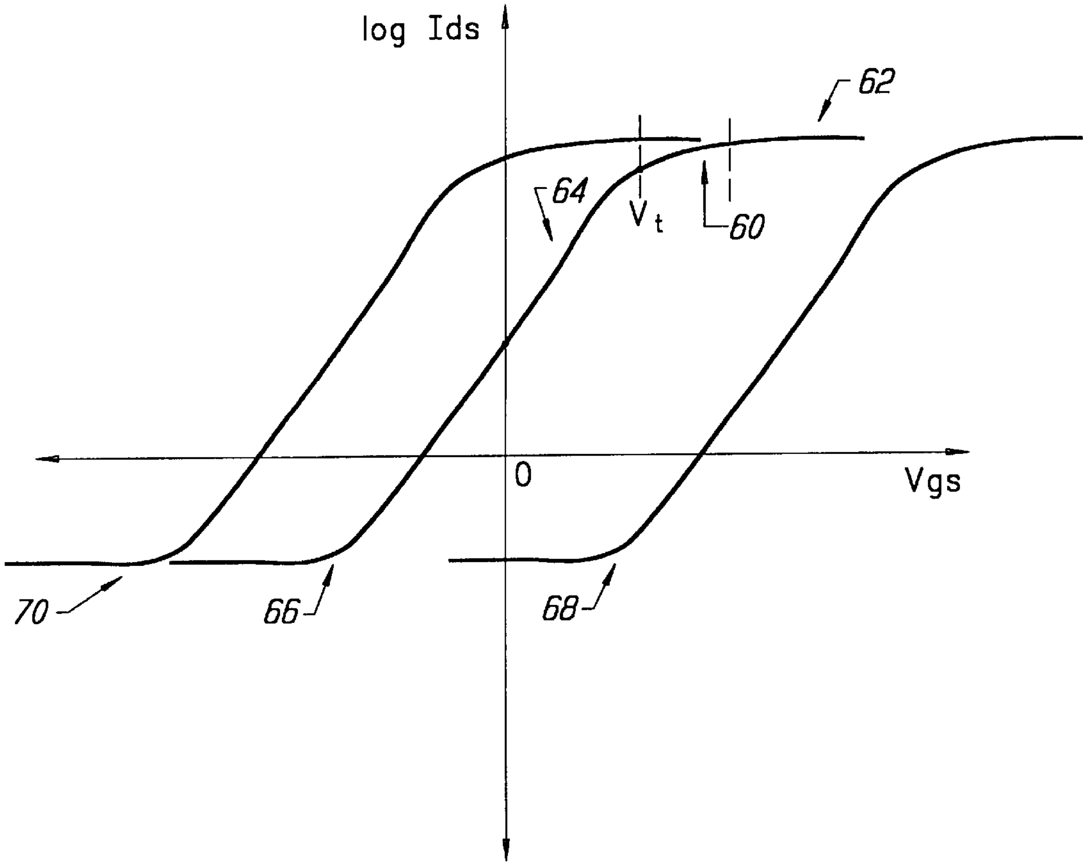
FIG. 3 is graph showing a typical family of device current (Ids) versus gate voltage (Vgs) curves for transistors having differing channel dopant concentrations.

As noted, the devices described herein are preferably characterized by a low threshold voltage and a corresponding relatively low vertical electric field. A low Vt, as defined herein, is an operating Vt that is at most about 2 decades (in current) from the point of zero gate voltage on a curve of channel current versus gate voltage for the device under consideration. This requirement is illustrated in FIG. 3 which shows a family of log Ids (logarithm of channel current) versus Vgs (gate voltage) curves for different devices. Each curve is provided for a different channel dopant concentration, with curves having subthreshold regions straddling the point where Vgs=0 describing devices having low channel dopant concentrations in accordance with the present invention. Referring to curve 66—which describes a device in accordance with this invention—a threshold voltage (Vt) is provided where subthreshold region 64 and transition region 60 meet. A-saturation region 62 exists beyond transition region 60 and is characterized by a linear current profile with increasing Vgs. Curves 70 and 68 describe devices having higher channel dopant concentrations than is appropriate for the present invention. The subthreshold Vg versus I slope is generally given by the equation, Ms=n $V_T$ ln(10), where Ms is the subthreshold slope, n is ideally 1, and $V_T$ is the thermal voltage, defined by kT/q. Thus, at room temperature, −120 mV<Vt<120 mV is the preferred range. At a temperature of 123K, −50 mV<Vt<50 mV is the preferred range.

By providing light doping in the channel region of a device, the device's threshold voltage will be at or near zero. Thus, it is desirable to provide a mechanism of tuning the threshold voltage. As noted above this can be accomplished by using back biasing. Preferably, the Vt of the transistor of the present invention is adjusted to a value between −150 mV and 150 mV for operation at room temperature. In general, a relatively large back bias voltage is required to adjust the threshold voltage a comparatively small amount. For example, 1 volt of back bias is required to adjust the Vt of a typical small channel transistor by 100 millivolts.

Backbiasing can be implemented using various automatic techniques. In one such method, a feedback amplifier adjusts the bias voltage of a well so that the drain current of a test device in the well matches a reference current. The tuning circuit can be designed to match the off current (in the range of 1 nanoamp to 1 microamp), or the on current in the 100 microamp/micrometer range.

Such circuits can sample the current from several test devices to obtain an average on current. The power dissipation of one of these well-tuning circuits is typically quite small, on the order of 1 microwatt, and its area is also small, typically about 100 square micrometers, so that hundreds or even thousands of such circuits can be distributed throughout a chip without significantly impacting area or power, while substantially improving low voltage performance by providing tightly controlled operating environments over small, local transistor populations.

Figure 4:
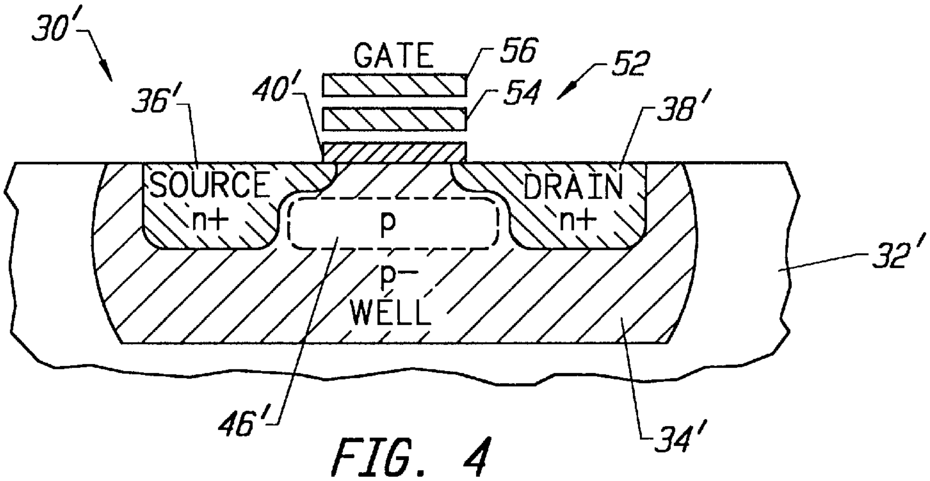
FIG. 4 is a side sectional view of a transistor having a floating gate structure in accordance with this invention.

FIG. 4 shows an alternative embodiment of a short channel MOSFET transistor 30' having a low threshold voltage that is tunable by a floating gate. Like the embodiment shown in FIG. 2, the transistor 30' of FIG. 4 includes well region 34', source region 36', and drain region 38'. Transistor 30' also includes a buried region 46' having a relatively high concentration of dopant extending between the source and drain in a relatively lightly doped bulk well 34'. MOSFET 30' includes two gate layers in a floating gate structure 52. First gate layer 54 is deposited on oxide layer 40', and second gate layer 56 is deposited above first gate layer 54 on an insulating layer. As is known in the art, a fixed voltage (and associated charge) may be applied to first gate 54 to control the threshold voltage of gate 56. Thus, by using the floating gate structure 52, the Vt of the transistor 30' can be electrically controlled in much the same manner as by using back biasing.

Figure 5:
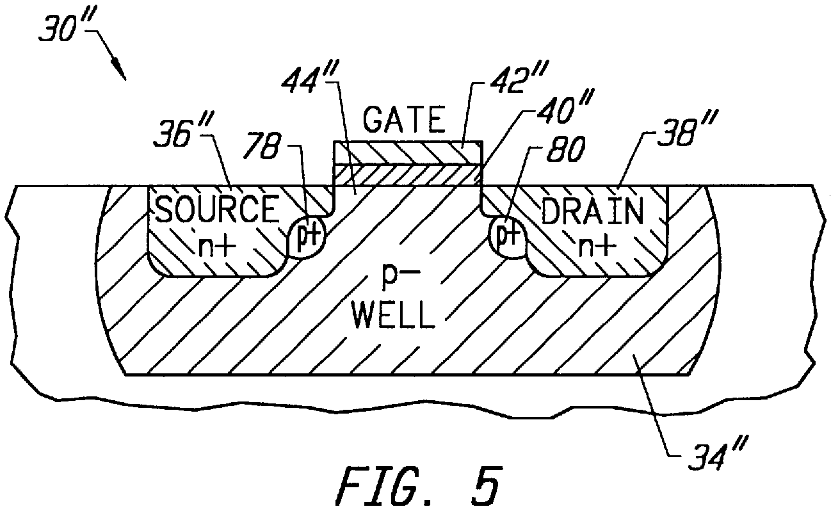
FIG. 5 is a side sectional view of a transistor having a symmetrical halo implant.

FIG. 5 shows another preferred embodiment of the present invention. In this embodiment, a device 30" is provided with a "halo implant" represented by p+regions 78 and 80 under source 36" and drain 38" tip regions. This implant provides punch through protection in the same manner as a buried layer or retrograde well. Device 30" includes a gate layer 42" disposed on an oxide layer 40" which overlies a channel region 44". In addition, source region 36" and drain region 38" are disposed within a well region 34". The dopant concentration ranges for device components in device 30 are also suitable for the components in 30". Thus, device 30" is similar in many regards to devices 30 and 30'. However, unlike devices having a buried electrode or retrograde well, the dopant concentration under the channel is very light (essentially the same level as the rest of the well), typically $1\times10^{15}$ atoms/$cm^3$ down to the bulk. There is no buried or retrograde profile except under the source and drain tips, and as may naturally result from forming the well itself.

Figure 6:
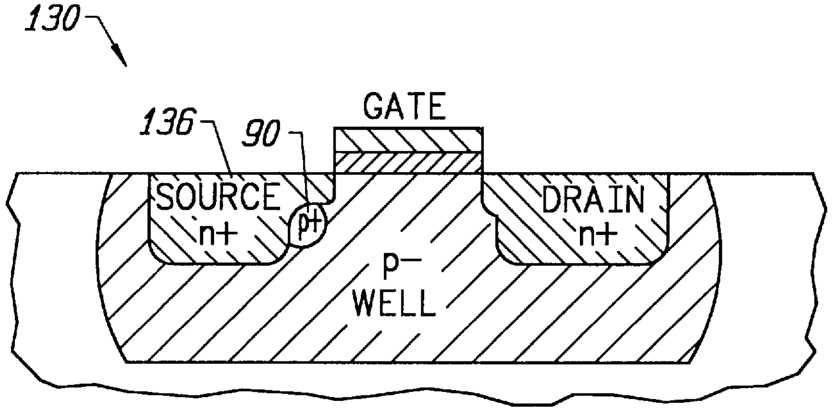
FIG. 6 is a side sectional view of a transistor having an asymmetrical halo implant.

FIG. 6 shows yet another preferred embodiment of the invention. In this embodiment, a device 130 includes an "asymmetric halo implant" represented by p+region 90 underneath the tip of source region 136. In other regards, device 130 is similar to devices 30, 30' and 30" described above. It should be borne in mind that each of various approaches to punch through protection (buried electrode, retrograde well, symmetric halo implant, and asymmetric halo implant) can be applied to devices having low threshold voltages as described above (produced with low channel doping) and/or tunable threshold voltages (provided by back biasing or a floating gate).

One of the objectives of the buried electrode is to achieve a low dopant concentration in the channel and higher dopant concentration at the edge of the gate-bulk depletion region. Ideally, this would be a step junction. However, limitations in ion implantations and thermal anneal cycles (late in the fabrication process) tend to smear out step junctions. This problem can be partially mitigated by selecting a dopant species which is relatively immobile (i.e., it has a relative low diffusion coefficient). Another approach is to grow a lightly doped silicon epitaxial layer on top of a heavily doped bulk substrate. The epitaxial depletion region can have a very abrupt junction and thereby come much closer to ideal step profile then can be produced by ion implantation.

Figure 7:
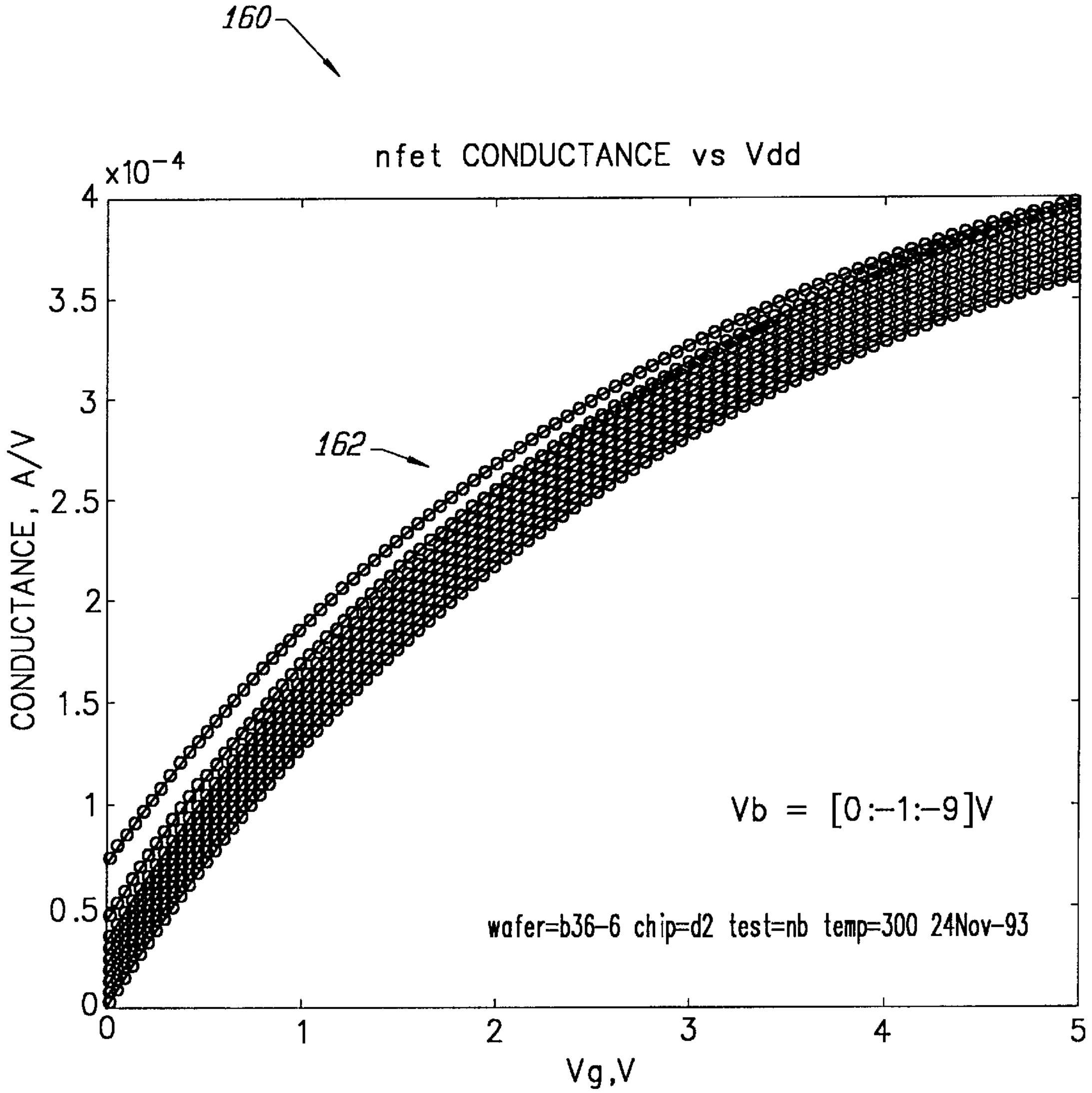
FIG. 7 is a graphical view of the performance of a transistor in room temperature conditions.

FIG. 7 shows a graph 160 of Ids/Vdd (conductance) vs. Vdd for a (long channel) low Vt transistor device operating at room temperature, which is about 300K. The conductance scale is a rough equivalent of performance of the device as a function of supply voltage. The family of curves 162 represent differing amounts of back bias applied to the transistor, wherein the leftmost curve represents no back bias. The curves 162 tend to flatten out at higher supply voltages, indicating a degree of saturation in the device. This is a direct consequence of the reduced threshold voltage which results in higher mobility and thereby reduces saturation voltage.

Figure 8:
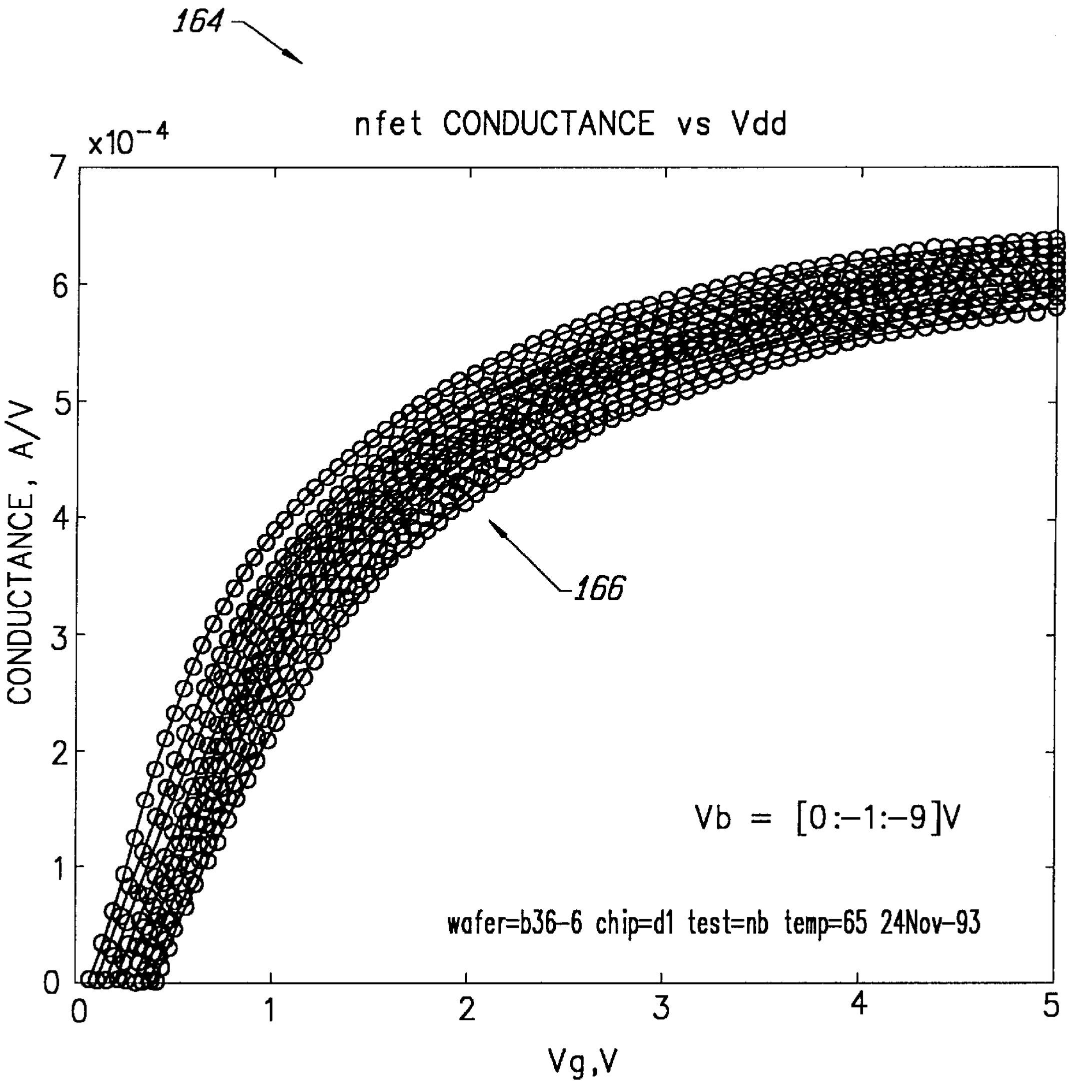
FIG. 8 is a graphical view of the performance of a transistor at a temperature of 65K.

FIG. 8 shows a graph 164 of the same (long channel) low-Vt transistor device of FIG. 7 operating at a lower temperature of 65K. The family of curves 166 represent different amounts of back bias, similar to FIG. 7. The cooled transistor is much more saturated, indicating that an increased performance can be gained from the cooled device at lower supply voltages. The performance of the transistor does not improve significantly over 1 volt of supply voltage, thus emphasizing that lower supply voltages can be used without loss in performance.

In general, CMOS devices operate differently at various temperatures. As a device is cooled, the charge carrier mobility in the channel increases. The threshold voltage also increases. Most importantly, the performance (frequency) of the transistor increases for a given threshold voltage due to the increased mobility of charge carriers and reduced the critical voltage of the device. Thus, at lower temperatures, even greater performance can be achieved with the transistor device of the present invention. This is generally true of long channel and short channel transistor devices. In fact, even greater saturation can be obtained in short channel transistor devices than in the long channel device of FIG. 7. To the first order, the saturation voltage is proportional to the effective channel length ($l_{eff}$), so that if $l_{eff}$ is cut in half, Vdd can be cut in half. FIG. 7 shows no improvement in performance above 1 volt and $l_{eff}$ equal to 2 $\mu$m. In a modern device, leff is about 0.3 $\mu$m, so it is expected that no improvement in performance will be realized above a Vdd of 100 mV, provided, of course, that the threshold voltage is reduced along with the supply. On the other hand, if Vt is 0.5 volts, then Vdd must be greater than 2.5 volts to realize maximum performance. This is why low thresholds are so important to low voltage performance in short channel devices.

A highly-saturated transistor device indicates that a lower supply voltage can be used without decreasing frequency. The critical voltage, or Vcrit, of the device is the minimum supply voltage at which velocity saturation occurs for the charge carriers in the channel. The lower the critical voltage, the lower the supply voltage while still keeping the channel saturated. The high mobility of charge carriers can thus be maintained at lower supply voltages. Operating the device at lower temperatures allows the saturation to occur at even lower supply voltages and increases the mobility of the charge carriers for improved performance.

To maximize performance at liquid nitrogen temperature (77K), the threshold voltage should be set to −223 mV at 300K. Because the current versus gate voltage curves shift with temperature, such devices will have a zero threshold voltage at 77K. This implies that the device doping profile may have to be reoptimized for operation at low temperatures. It may be possible to provide the device with sufficient tunability to operate over the entire temperature range. However, this extra tunability may compromise performance in some devices. When this is the case, devices will need to be optimized over a relatively narrow specified temperature range.

When implementing low temperature CMOS transistors of the present invention, a cooling environment can be provided. A temperature of 123K is especially desirable, since this temperature can be maintained with a small refrigerator, for example, with reasonable power cost while providing a substantial performance increase. Below 123K, refrigeration costs become significantly higher, and carrier freeze out effects may create instabilities in that are difficult to control.

In many short channel MOSFET devices, a large horizontal electric field associated with a relatively high Vdd can cause hot electron degradation, in which electrons penetrate the oxide layer above the bulk region or the drain region. This problem is typically solved using lightly doped drain (LDD) implants which provide a relatively low concentration of dopants in the tip regions 36A and 38A of source and drain regions 36 and 38. In the present invention, however, LDD's are typically not necessary, since the problem of hot electrons becomes negligible at supply voltages below about 1.5 volts.

Although certain preferred embodiments of the present invention have been described, it should be understood that the present invention may be embodied in many other specific forms without departing from the spirit or scope of the invention. Particularly, the NFETs illustrated above can be replaced with PFETs and the buried regions may find some usefulness in large channel devices. Therefore, the present examples are to be considered as illustrative and not restrictive, and the invention is not to be limited to the details given herein, but may be modified within the scope of the appended claims.

We claim:

1. An improved junction transistor formed on a semiconductor substrate, the junction transistor switching when a threshold gate voltage is applied, the transistor comprising:

a well region having an average dopant concentration of a first conductivity type extending from a top surface of the semiconductor substrate downward into the substrate;

a source region of a second conductivity type positioned within said well region;

a drain region of the second conductivity type positioned within said well region;

a channel region within said well region and separating the source and drain regions, wherein said channel region has a width of about 2 microns or less and a dopant concentration in the channel region is between about $1\times10^{14}$ and $1\times10^{16}$ atoms/cm$^3$;

a gate positioned over the top surface of the substrate and over the channel region, said gate having an electrically tunable threshold voltage and having a threshold voltage magnitude of at most about 150 mV at room temperature; and a buried region of the first conductivity type within the well region and disposed beneath of the channel region and spanning the length of the channel region, said buried region having a dopant concentration of the first conductivity type that is between about 10 and 100 times greater than the average dopant concentration in the well region, wherein the buried region dopant concentration is between about $1\times10^{17}$ and $1\times10^{18}$ atoms/cm$^3$; and a contact connected to the source region and an ohmic contact connected to the well region such that the potential difference between the source and well regions can be adjusted to tune the gate threshold voltage by back biasing.

2. The improved junction transistor of claim 1 wherein the buried region is a buried electrode.

3. The improved junction transistor of claim 1 wherein the buried region forms part of a retrograde well having a graded dopant concentration of the first conductivity type such that the dopant concentration is greater near a bottom of the well.

4. The improved junction transistor of claim 1 wherein the gate is a floating gate having a tunable threshold voltage.

5. The improved junction transistor of claim 1 wherein a gate threshold voltage has a magnitude of at most about 120 mV.

6. The MOS transistor of claim 1 wherein the dopant concentration of the second conductivity type in the source and drain regions is $5\times10^{19}$ and $2\times10^{20}$ atoms/$cm^3$ adjacent the channel region.

7. The MOS transistor of claim 1 wherein the buried region is located such that it does contact either the source or the drain region.

8. A MOS transistor formed on semiconductor substrate, the MOS transistor switching when a threshold gate voltage is applied, the transistor comprising:

a well region having an average dopant concentration of a first conductivity type extending from a top surface of the semiconductor substrate downward into the substrate;

a source region of a second conductivity type positioned within said well region;

a drain region of the second conductivity type positioned within said well region;

a channel region within said well region and separating the source and drain regions, wherein said channel region has a width of about 2 microns or less and a dopant concentration in the channel region is between about $1\times10^{14}$ and $1\times10^{16}$ atoms/$cm^3$;

a gate positioned over the channel region, said gate having an electrically tunable threshold voltage at which a device current is at most about 2 decades greater than at a point of zero gate voltage on a subthreshold region of a current versus gate voltage curve for said transistor such that the threshold voltage has a magnitude of at most about 150 mV at room temperature; and a buried electrode of the first conductivity type within the well region and disposed outside of and beneath the channel region, said buried electrode having a dopant concentration of the first conductivity type that is between about 10 and 100 times greater than the average dopant concentration in the well region, wherein the buried electrode dopant concentration is between about $1\times10^{17}$ and $1\times10^{18}$ atoms/$cm^3$; and a contact connected to the source region and an ohmic contact connected to the well region such that the potential difference between the source and well regions can be adjusted to tune the gate threshold voltage by back biasing.

9. The MOS transistor of claim 8 wherein the threshold voltage is between about +/−120 millivolts.

10. The MOS transistor of claim 8 wherein the buried electrode has a peak dopant concentration of greater than about $1\times10^{17}$ atoms/$cm^3$.

11. The MOS transistor of claim 8 wherein the dopant concentration of the second conductivity type in the source and drain regions is $5\times10^{19}$ and $2\times10^{20}$ atoms/$cm^3$ adjacent the channel region.

12. The MOS transistor of claim 8 wherein the buried region is located such that it does not extend under either the entire source or the entire drain region.

* * * * *

UNITED STATES PATENT AND TRADEMARK OFFICE

CERTIFICATE OF CORRECTION

PATENT NO. : 5,773,863
DATED : June 30, 1998
INVENTOR(S) : Burr et al.

It is certified that error appears in the above-identified patent and that said Letters Patent is hereby corrected as shown below:

Column 11,
Line 19, after "is" add the word -- between --.
Line 22, after "does" add the word -- not --.

Column 12,
Line 31, after "is" add the word -- between --.

Signed and Sealed this

Twenty-seventh Day of November, 2001

*Attest:*

Nicholas P. Godici

NICHOLAS P. GODICI

*Attesting Officer*

*Acting Director of the United States Patent and Trademark Office*